(12) United States Patent
Zhu et al.

(10) Patent No.: US 11,527,648 B2
(45) Date of Patent: Dec. 13, 2022

(54) TRANSISTORS WITH SWITCHABLE POLARITY AND NON-VOLATILE CONFIGURATIONS

(71) Applicant: The Board of Trustees of the University of Illinois, Urbana, IL (US)

(72) Inventors: Wenjuan Zhu, Champaign, IL (US); Kai Xu, Champaign, IL (US); Jialun Liu, San Ramon, CA (US); Zijing Zhao, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 17/164,472

(22) Filed: Feb. 1, 2021

(65) Prior Publication Data

US 2021/0249539 A1 Aug. 12, 2021

Related U.S. Application Data

(60) Provisional application No. 62/971,602, filed on Feb. 7, 2020.

(51) Int. Cl.
*H01L 29/78* (2006.01)
*H01L 29/51* (2006.01)

(52) U.S. Cl.
CPC ...... *H01L 29/78391* (2014.09); *H01L 29/516* (2013.01); *H01L 29/7831* (2013.01)

(58) Field of Classification Search
CPC ......... H01L 29/40111; H01L 29/78681; H01L 29/7869; H01L 29/7831–7832; H01L 2924/13092; H01L 29/66484; H01L 2924/13084–13085; H01L 29/6684; H01L 29/78391; H01L 21/823842
See application file for complete search history.

(56) References Cited

U.S. PATENT DOCUMENTS

| 8,227,701 | B2 | 7/2012 | Wrazien et al. |
| 2013/0135008 | A1 | 5/2013 | Zhang et al. |
| 2016/0056301 | A1* | 2/2016 | Lee ................... H01L 29/42352 257/295 |
| 2020/0098880 | A1* | 3/2020 | Sharma ............... H01L 27/2436 |
| 2020/0105892 | A1* | 4/2020 | Haratipour .............. H01L 27/10 |

(Continued)

OTHER PUBLICATIONS

Pang et al., "WSe2 Homojunction Devices: Electrostatically Configurable as Diodes, MOSFETs, and Tunnel FETs for Reconfigurable Computing", Small, 2019, pp. 1-8, vol. 15, No. 1902770, WILEY-VCH Verlag GmbH & Co. KGaA, Weinheim.

(Continued)

*Primary Examiner* — Shahed Ahmed
(74) *Attorney, Agent, or Firm* — Greer, Burns & Crain, Ltd.; Steven P. Fallon

(57) ABSTRACT

Transistors with switchable polarity and non-volatile configurations are provided. The transistors include a van der Waals (vdW) semiconductor layer. A ferroelectric layer with local polarization determines the type and concentration of the doping in the vdW semiconductor layer. Local program gates allow application of voltage to set or switch the polarization in the ferroelectric layer in the source and drain regions. Source and drain contacts permit either n-type or p-type transistor operations according to the carrier polarity in the vdW semiconductor layer.

15 Claims, 10 Drawing Sheets

(56) References Cited

U.S. PATENT DOCUMENTS

2020/0395499 A1* 12/2020 Ogawa .................. H01L 31/113
2020/0403079 A1* 12/2020 Hong ................ H01L 27/10876
2021/0217952 A1*  7/2021 Jarillo-Herrero ... H01L 45/1233

OTHER PUBLICATIONS

Nakaharai et al., "Electrostatically Reversible Polarity of Ambipolar α-MoTe2 Transistors", ACS Nano, 2015, pp. 5976-5983, vol. 9, No. 6, American Chemical Society.

Resta et al., "Polarity control in WSe2 double-gate transistors", Scientific Reports, 2016, pp. 1-6, vol. 6, No. 29448, Nature.

Dreslinski et al., "Centip3De: A 64-Core, 3D Stacked Near-Threshold System", IEEE Micro, 2013, pp. 8-16, vol. 33, No. 2, IEEE Computer Society.

Müller et al., "Gate-Controlled WSe2 Transistors Using a Buried Triple-Gate Structure", Nanoscale Research Letters, 2016, pp. 1-6, vol. 11, No. 512, Springer Open.

Farmahini-Farahani et al., "DRAMA: An Architecture for Accelerated Processing Near Memory", IEEE Computer Architecture Letters, 2015, pp. 26-29, vol. 14, No. 1, IEEE.

Das et al., "Electrostatically Doped WSe2 CMOS Inverter", 72nd Device Research Conference, 2014, pp. 185-186, IEEE, Santa Barbara, California.

Dhakras et al., "Three fundamental devices in one: a reconfigurable multifunctional device in two-dimensional WSe2", Nanotechnology, 2017, pp. 1-7, vol. 28, No. 265203, IOP Publishing Ltd, United Kingdom.

\* cited by examiner

TRANSISTORS WITH SWITCHABLE POLARITY AND NON-VOLATILE CONFIGURATIONS

PRIORITY CLAIM AND REFERENCE TO RELATED APPLICATION

The application claims priority under 35 U.S.C. § 119 and all applicable statutes and treaties from prior U.S. provisional application Ser. No. 62/971,602, which was filed Feb. 7, 2020.

FIELD

The field relates generally to solid-state semiconductor devices, integrated logic circuits and memory circuits.

BACKGROUND

Power consumption and operating speed of modern integrated circuits are limited by the so-called "memory bottleneck", which refers to the fact that more time and energy are spent transferring data between memory and computing than with the computation itself. One proposed solution to this problem is the processor-in-memory (PIM) architecture, which stacks a logic layer in 3D with a dynamic random-access memory (DRAM) layer, to reduce energy consumed in data transfer, while simultaneously increasing performance [See References 1, 2].

3D integration in these types of circuits is typically achieved by stacking wafers/dies and interconnecting them vertically, using through-silicon vias (TSVs). Such integrations have drawbacks of high cost, long vertical distance between the wafers, and a very limited number of wafers that can be stacked.

Recently, it was demonstrated that the type of transistors based on van der Waals (vdW) materials can be dynamically switched between nMOSFET and pMOSFET by electrostatic gating [See References 3-8]. These transistors include a local program gate, which controls the conduction type of the transistor. While the vdW transistor function is switched through electrostatic gating, these devices need continuous voltage supply on the program gates to maintain the doping level. Such continual power demand is not practical for modern devices.

Wrazien et al. U.S. Pat. No. 8,227,701 disclosed reconfigurable electric devices based upon a quasi-two-dimensional electron gas (q2DEG) in interface regions of crystalline material layers. By switching the polarization direction, the q2DEG can be turned "ON" or "OFF". However, this type of device does not have ambipolar van der Waals materials in the channel and program gates. In addition, these transistors do not have a conduction type switching function.

Another reconfigurable logic is based upon changing connection paths and does not provide a way to change transistor carrier polarity. Zhang et al. US20130135008 discloses reconfigurable computer architectures. Changes in connections between logic units produces different functions and the coupling between RAM units and logic units can be changed. The functions at transistor level and also logic level remain fixed.

REFERENCES

[1] R. G. Dreslinski et al., "Centip3De: A 64-Core, 3D Stacked Near-Threshold System," *IEEE Micro, vol.* 33, no. 2, pp. 8-16, 2013.

[2] A. Farmahini-Farahani, J. H. Ahn, K. Morrow, and N. S. Kim, "DRAMA: An Architecture for Accelerated Processing Near Memory," *IEEE Computer Architecture Letters*, vol. 14, no. 1, pp. 26-29, 2015.

[3] *Electrostatically doped WSe2 CMOS inverter,* 978-1-4799-5406-3, 2014.

[4] S. Nakaharai, M. Yamamoto, K. Ueno, Y. F. Lin, S. L. Li, and K. Tsukagoshi, "Electrostatically Reversible Polarity of Ambipolar alpha-MoTe2 Transistors," (in English), *Acs Nano*, vol. 9, no. 6, pp. 5976-5983, June 2015.

[5] G. V. Resta et al., "Polarity control in WSe2 double-gate transistors," (in English), *Scientific Reports*, vol. 6, Jul. 8, 2016.

[6] P. Dhakras, P. Agnihotri, and J. U. Lee, "Three fundamental devices in one: a reconfigurable multifunctional device in two-dimensional WSe2," (in English), *Nanotechnology*, vol. 28, no. 26, Jun. 30, 2017.

[7] M. R. Muller et al., "Gate-Controlled WSe2 Transistors Using a Buried Triple-Gate Structure," (in English), *Nanoscale Research Letters*, vol. 11, Nov. 22, 2016.

[8] C. S. Pang et al., "WSe2 Homojunction Devices: Electrostatically Configurable as Diodes, MOSFETs, and Tunnel FETs for Reconfigurable Computing," (in English), *Small*, vol. 15, no. 41, October 2019.

SUMMARY OF THE INVENTION

An embodiment of the invention is a transistor with switchable polarity and non-volatile configurations. The transistor includes a van der Waals (vdW) semiconductor layer. A ferroelectric layer with local polarization determines the type and concentration of the doping in the vdW semiconductor layer. Source and drain electrodes contact the vdW semiconductor layer. Local program gates at source and region regions, arranged to allow application of voltage to set or switch the polarization in the ferroelectric layer. Preferred embodiments include top gate, bottom gate and/or embedded gate in the transistors.

Preferred transistor have the ferroelectric layer being selected from the group consisting of ferroelectric hafnium or zirconium oxide, a perovskite including but not limited to lead zirconate titanate (PZT), Barium titanate (BTO), and lead magnesium niobate-lead titanate (PMN-PT), aurivillius compounds including but not limited to strontium bismuth tantalate (SBT), polymeric ferroelectric including but not limited to polyvinylidene fluoride (PVDF), and vdW ferroelectrics including but not limited to $CuInP_2S_6$ (CIPS). Preferred transistors have the vdW channel material selected from the group consisting of black phosphorous, $MoTe_2$, $WSe_2$, $HfS_2$, $ZrS_2$, $TiS_2$, $Mo_{1-x}W_xTe_2$, $MoS_{2-x}Te_{2x}$, $MoSe_{2-x}Te_{2x}$, $WS_{2-x}Te_{2x}$, $WSe_{2-x}Te_{2x}$, $Hf_2CO_2$, $Sc_2CF_2$, $Ti_2CO_2$, $Zr_2CO_2$, germanane, and heterostructures based on these materials. Transistors can be formed on various substrates including those selected from the group consisting of silicon, germanium, III-V materials, sapphire, and quartz, polyethylene terephthalate (PET), polymide, poly(dimethyl siloxane) (PDMS).

Preferred transistors can be connected to form a logic circuit. The transistors within the logic circuit can have their polarity reconfigured to change the function of the logic circuit. One or more of the logic circuits can be monolithically integrated with memory in a 3D structure.

DETAILED DESCRIPTION OF THE PREFERRED EMBODIMENTS

Figure 1A:
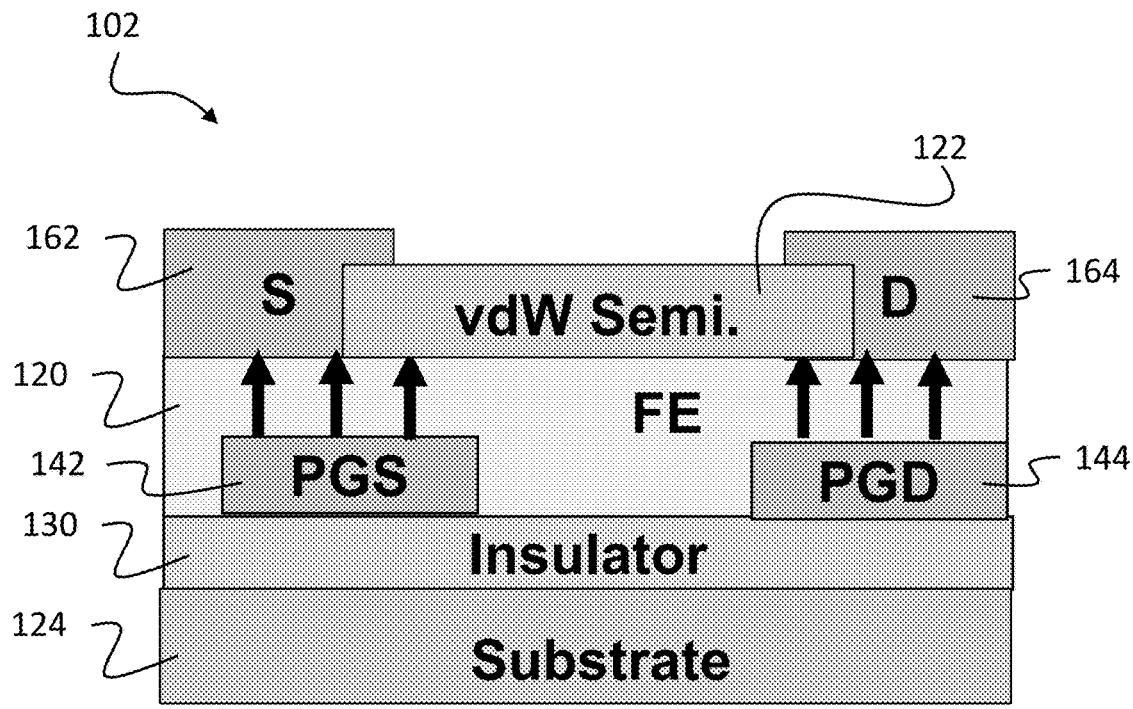
FIGS. 1A-1H are schematic cross-section views of preferred embodiments for transistors with switchable polarity and non-volatile configurations based on ferroelectric materials and van der Waals materials.

Preferred embodiments provide transistors with switchable polarity and non-volatile configuration based on ferroelectric materials, which can be integrated with memory circuits monolithically and the function of the transistors can be dynamically changed during operation. Once changed, the function is retained without application of power, i.e., the function is programmed and then remains static until changed again.

Logic circuits enabled by the present reconfigurable transistor devices can evolve with time based on the demand for the next operation or calculation. Transistors can be combined into logic blocks. In this way, many data transfers can be avoided. A logic block on top or underneath the memory block can fulfill all the needed data analysis and processing operations by its reconfiguration. Preferred solid-state ferroelectric reconfigurable transistors enable a new computing paradigm, where the process latency and energy consumption due to the memory bottleneck can be substantially reduced.

Preferred embodiments of the invention will now be discussed with respect to the drawings and experiments. The drawings may include schematic representations, which will be understood by artisans in view of the general knowledge in the art and the description that follows. Features may be exaggerated in the drawings for emphasis, and features may not be to scale.

FIGS. 1A-1H illustrate preferred transistors with switchable polarity and non-volatile configurations 102, 104, 106, 108, 112, 114, 116 and 118 using ferroelectric (FE) layers 120 and vdW semiconductor layer 122. In transistors 102, 104, 106 and 108, the ferroelectric layer 120 is underneath the vdW semiconductor layer 122, while in transistors 112, 114, 116 and 118, the ferroelectric layer 120 is above the vdW semiconductor layer 122. In the figures, comment reference numerals are used to indicate like features. In example tested transistors targeting conventional transistor operating voltages, channels 120 were formed from vdW materials with a small-to-medium bandgap, from ~0.3 to ~1.4 eV. Larger bandgap vdW materials can also be used with a corresponding increase in applied voltage needed for transistor operation, as will be appreciated by artisans. The ferroelectric layer 120 is selected from the group consisting of ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), polymeric ferroelectric such as polyvinylidene fluoride (PVDF), and vdW ferroelectrics such as $CuInP_2S_6$ (CIPS). The vdW semiconductor layers 122 can be selected from but is not limited to the group consisting of black phosphorous, $MoTe_2$, $WSe_2$, $HfS_2$, $ZrS_2$, $TiS_2$, $Mo_{1-x}W_xTe_2$, $MoS_{2-2x}Te_{2x}$, $MoSe_{2-2x}Te_{2x}$, $WS_{2-2x}Te_{2x}$, $WSe_{2-2x}Te_{2x}$, $Hf_2CO_2$, $Sc_2CF_2$, $Ti_2CO_2$, $Zr_2CO_2$, germanane, and heterostructures based on these materials. The substrate 124 is selected from the group consisting of silicon, germanium, III-V materials, sapphire, and quartz, polyethylene terephthalate (PET), polymide, poly(dimethyl siloxane) (PDMS). In device 102 shown in FIG. 1A and transistor 112 in FIG. 1E, the substrates also serve as the back gate (BG), which limit the choice of the substrate to semiconducting materials including silicon, germanium, and III-V materials. A source 162 and drain 164 each contact the vdW semiconducting layer 122. The transistors 104, 108, 114, and 118, include top gates (TG) 146. The transistors 106, 108, 116 and 118 include embedded gates (EG) 148. The substrates 124 are isolated by an insulator layer 130. The insulator layer 130 can be $SiO_2$, $Si_3N_4$, $Al_2O_3$, $HfO_2$, $ZrO_2$, or a combination of these materials. Another insulator layer 132 serves to isolate the embedded gate 148 from the local program gates (PGS 142 and PGD 144), the source 162, the drain 164 or the vdW semiconductor layer 122. The insulator layer 136 serves to isolate the top gate (TG) 146 and the vdW semiconductor layer 122, the source 162, the drain 164 or the local program gates (PGS 142 and PGD 144). The transistors 102, 104, 106, 108, 112, 114, 116 and 118 include local program gates (PGS 142 and PGD 144, i.e. program gate at the source region and program gate at the drain region, which are interchangeable according to polarity determined by the ferroelectric layer 120). The carrier type and concentration in the vdW semiconductor layer 122 are controlled by the polarization of the ferroelectric layer 120, which with the local program grates 142 and 144 can be controlled on a transistor-by-transistor basis. The semiconductor vdW layer 122 and FE layer 120 are sandwiched between the local program gates (PGS 142 and PGD 144) and the source 162 and drain 164. As a result, individual transistors can have their conduction type dynamically reconfigured into p-type, ambipolar or n-type. In transistors 104, 106, 108, 114, 116 and 118, the transistor polarity can be read out using local top gate (TG) 146 and/or local embedded gate (EG) 148. In these configurations, the TG 146 and EG 148 can also serve as additional local programming gates. Whichever gates are used for programming, those gates and the source/drain terminal need to be at least partially aligned in the out-of-plane direction.

In the transistor 102 of FIG. 1A, an insulator layer 130 is formed on the substrate 124. Local program gates PGS 142 and PGD 144 are formed on the insulator layer 130. Ferroelectric layer 120 is formed on the program gates PGS 142 and PGD 144. A vdW semiconductor layer 122 is formed on the ferroelectric layer 120. The source 162 and drain 164 are formed on the vdW semiconductor layer 122. The program gate PGS 142 is at least partially aligned with the source 162, while the program gate PGD 144 is at least partially aligned with the drain 164. To program the transistor, voltages are applied between the PGS 142 and the source 162, and between PGD 144 and the drain 164. These vertical electric fields will control the local polarization in the ferroelectric layer 120 in between the program gate PGS 142 and the source 162 and the polarization in the ferroelectric layer 120 in between the program gate PGS 144 and the drain 164. The direction and amplitude of the local polarization in the ferroelectric layer 120 will determine the type and concentration of the electrostatic doping in the vdW semiconductor 122, which will control the polarity of the transistor. The substrate 124 serves as the back gate. The transistor characteristics can be read out using the back gate (substrate) 124.

Figure 1B:
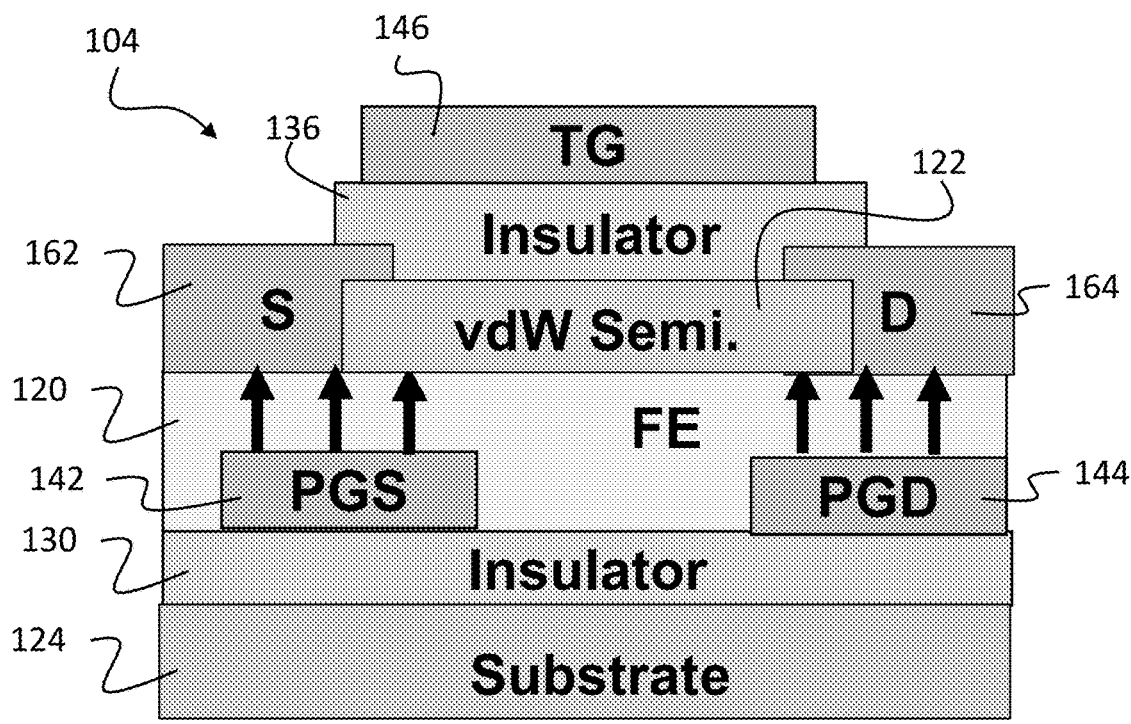

In the transistor 104 of FIG. 1B, in addition to the layers in transistor 102, a top gate (TG) 146 and an insulator layer 136 are formed on top of the vdW semiconductor layer 122. In this case, the transistor characteristics can be read out using either the top gate 146 or the back gate (substrate) 124.

Figure 1C:
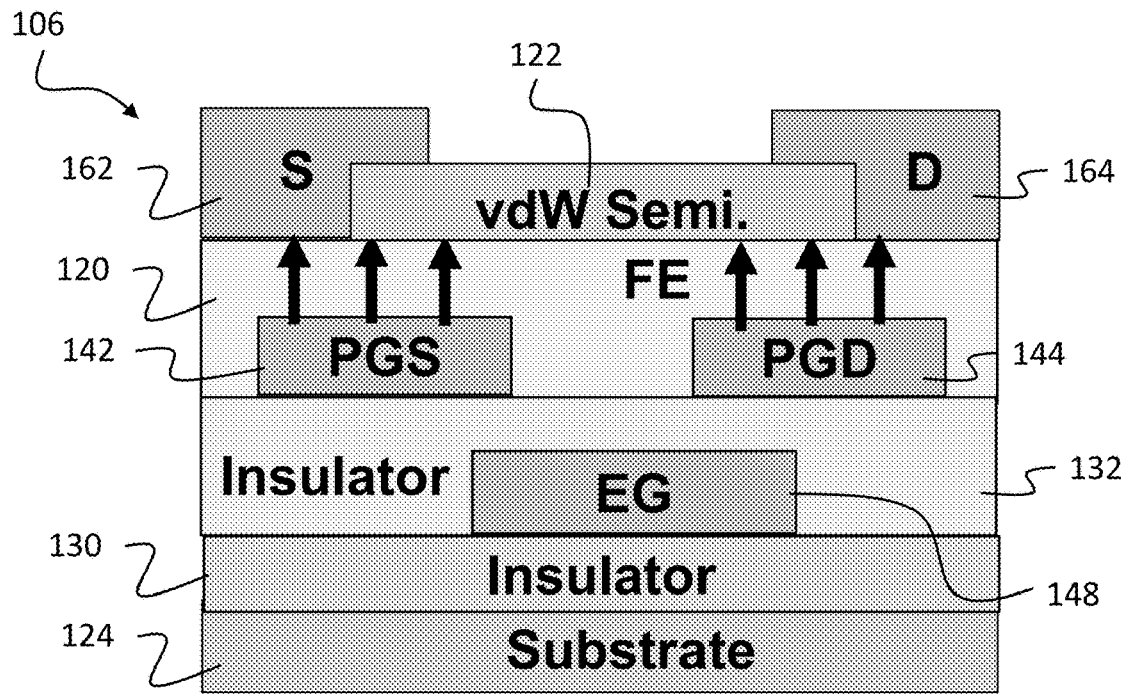

In the transistor 106 of FIG. 1C, a local embedded gate (EG) 148 is formed under the ferroelectric layer 120. Insulator 132 separates the embedded gate 148 and the local program gates (PGS 142 and PGD 144) and the ferroelectric layer 120. The local program gates are used to program the polarity of the transistor. The transistor characteristics can be read out using the embedded gate 148.

Figure 1D:
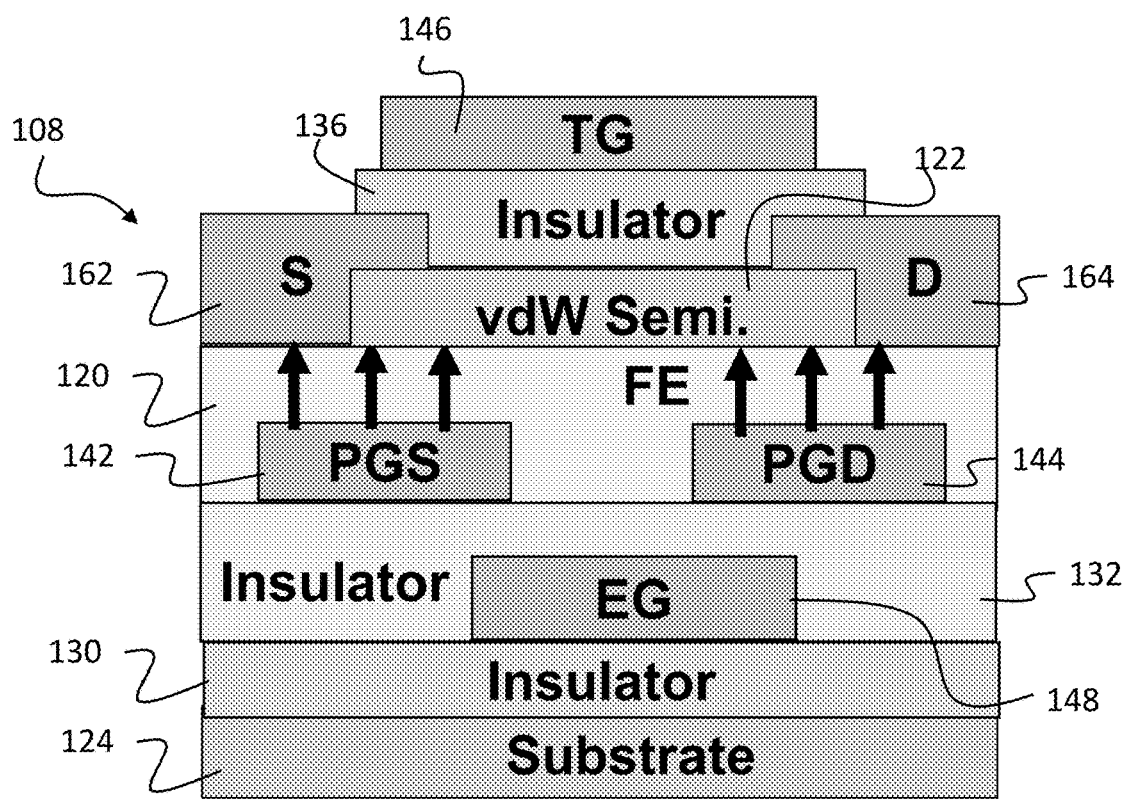

In transistor 108 of FIG. 1D, in addition to the layers in transistor 106, a top gate (TG) 146 and an insulator layer 136 are formed on top of the vdW semiconductor layer 122. To program the transistor, voltages are applied between the PGS 142 and the source 162, and between PGD 144 and the drain 164. These vertical electric fields will control the local polarization in the ferroelectric layer 120, which will determine the doping type and doping concentration in vdW semiconductor layer 122 in the source and the drain regions. In addition, program voltage can be applied between the top gate 146 and the embedded gate 148, which will control the polarization in the ferroelectric layer 120 in the center region, corresponding to the overlap between the top gate 146 and embedded gate 148. These local polarizations in the ferroelectric layer 120 will determine the doping concentration in the vdW channel and the threshold voltage of the transistor. The transistor characteristics can be read out using the top gate 146.

Figure 1E:
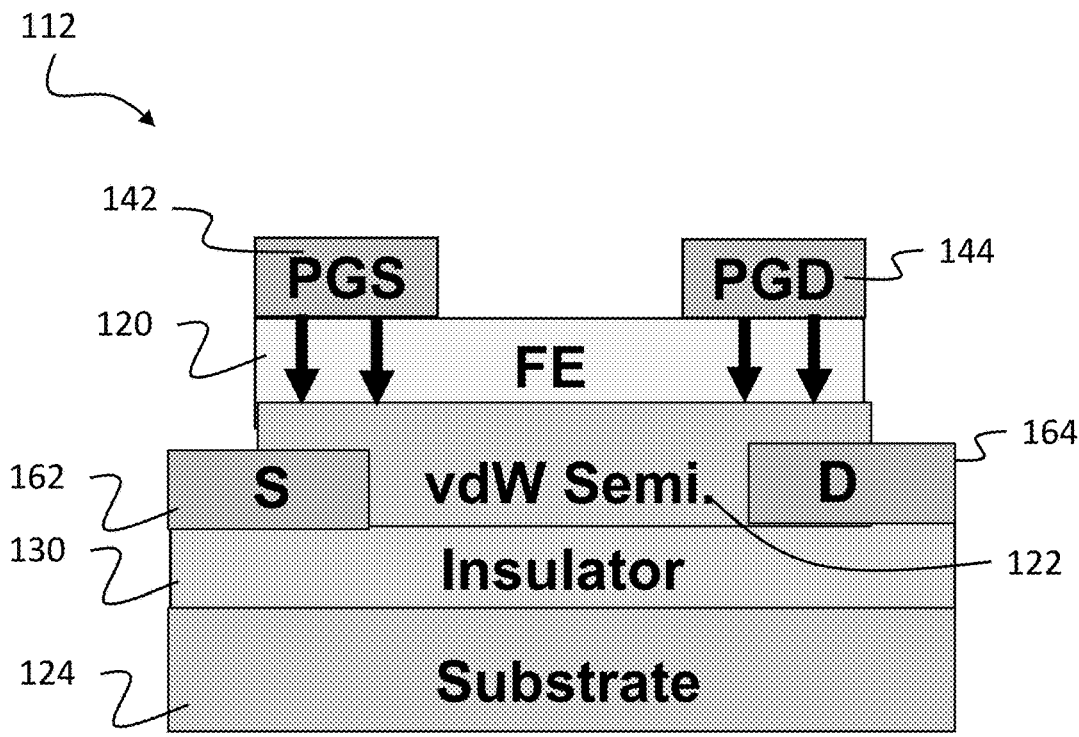

In the transistor 112 of FIG. 1E, an insulator layer 130 is formed on the substrate 124. The source 162 and drain 164 are formed on the insulator layer 130. VdW semiconductor layer 122 is formed on the source 162 and the drain 164. The ferroelectric layer 120 is formed on top of the vdW semiconductor layer 122 and the local program gates PGS 142 and PGD 144 are formed on top of the ferroelectric layer 120 in the source and drain regions. To program the transistor, voltages can be applied between the program gate PGS 142 and the source 162, and between program gate PGD 144 and the drain 164. The substrate 124 serves as the back gate. The transistor characteristics can be read out using the back gate (substrate) 124.

Figure 1F:
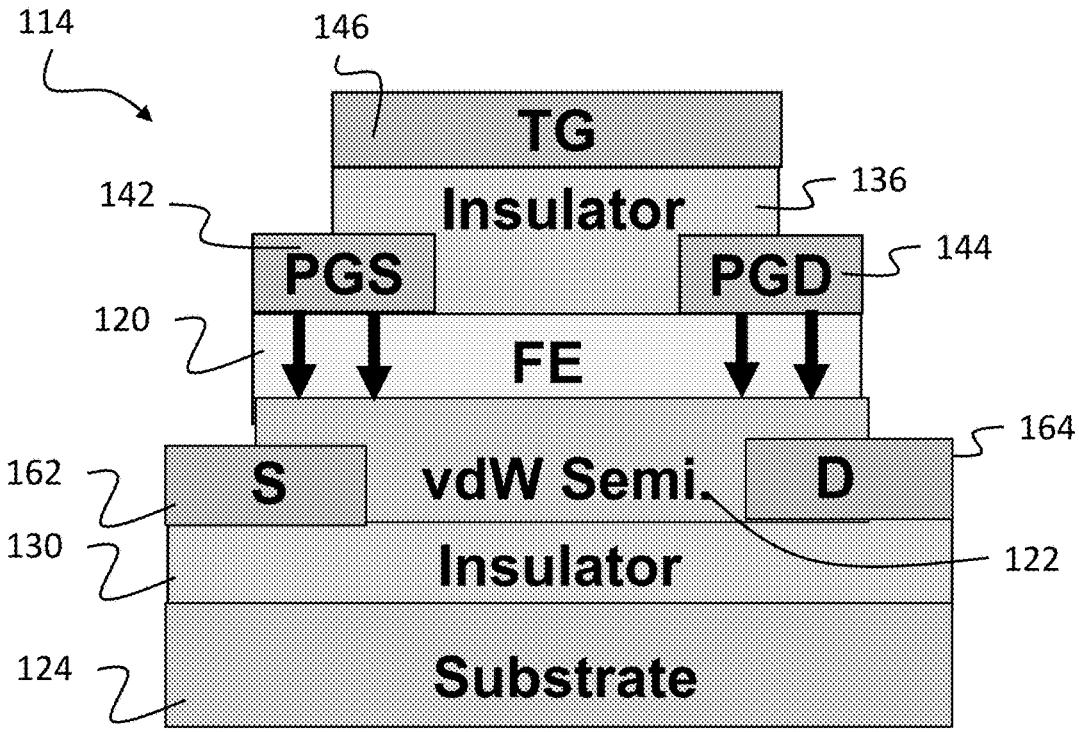

In the transistor 114 of FIG. 1F, in addition to the layers in transistor 112, a top gate (TG) 146 and an insulator layer 136 are formed on top of the program gate PGS 142, program gate PGD 144 and ferroelectric layer 120. In this case, the transistor characteristics can be read out using either the top gate 146 or the back gate (substrate) 124.

Figure 1G:
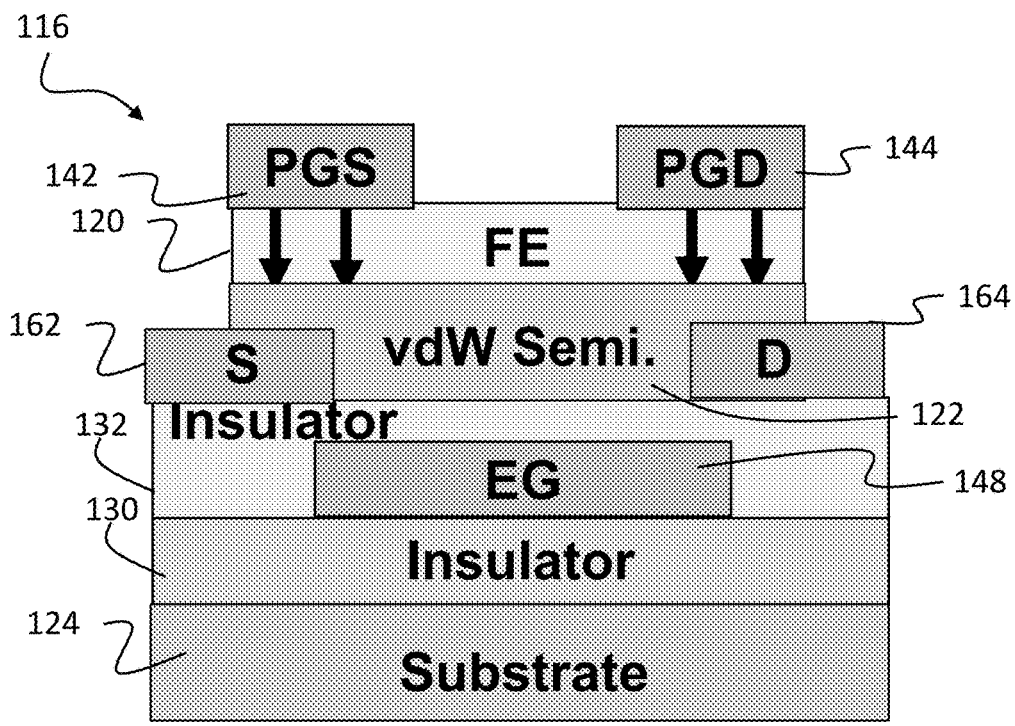

In the transistor 116 of FIG. 1G, an insulator layer 130 is formed on the substrate 124 and an embedded gate 148 is formed on the insulator layer 130. An insulator 132 is formed on the embedded gate 148. The source 162 and drain 164 are formed on the insulator 132. The vdW semiconductor layer 122 is formed on the source 162 and the drain 164. The ferroelectric layer 120 is formed on the vdW semiconductor layer 122. The local program gates PGS 142 and PGD 144 are formed on top of the ferroelectric layer 120 in the source and drain regions. To program the transistor, voltages can be applied between the PGS 142 and the source 162, and between PGD 144 and the drain 164. The transistor characteristics can be read out using the embedded gate 148.

Figure 1H:
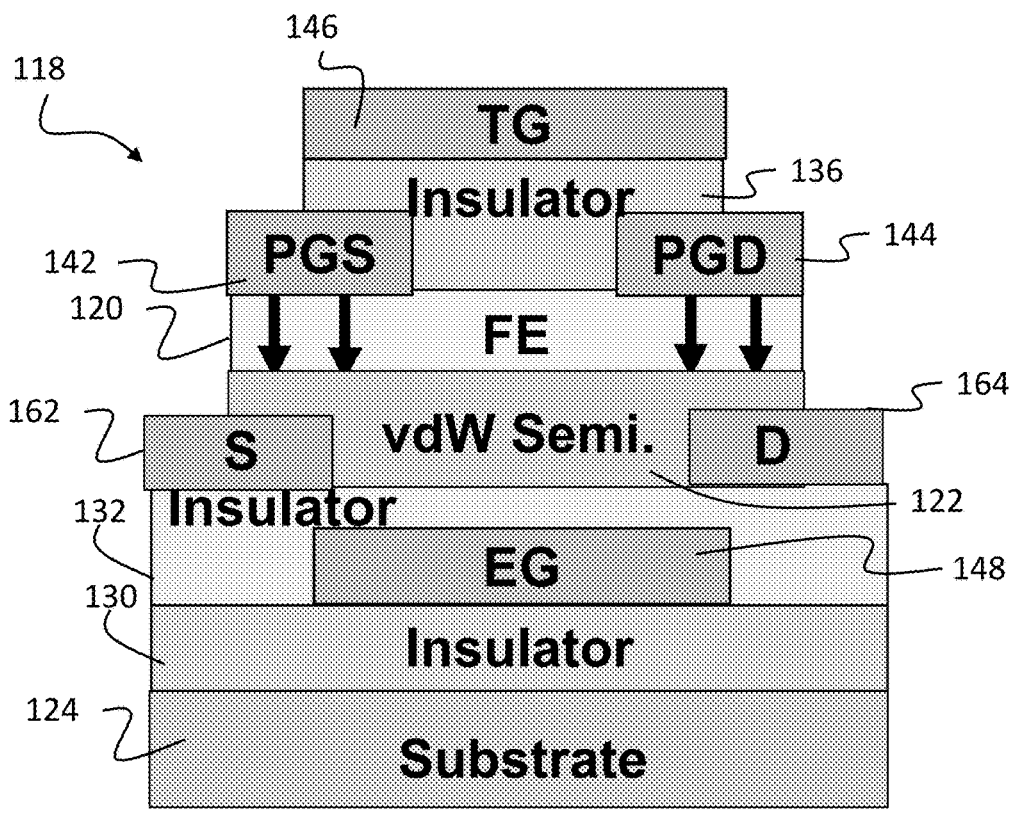

In the transistor 118 of FIG. 1H, in addition to the layers in transistor 116, a top gate (TG) 146 and an insulator layer 136 are formed on top of the vdW semiconductor layer 122. To program the transistor, voltages are applied between the PGS 142 and the source 162, and between PGD 144 and the drain 164. These vertical electric fields will control the local polarization in the ferroelectric layer 120, which will determine the doping type and doping concentration in vdW semiconductor layer 122 in the source and the drain regions. In addition, program voltage can be applied between the top gate 146 and the embedded gate 148, which will control the polarization in the ferroelectric layer 120 in the center region, corresponding to the overlap between the top gate 146 and embedded gate 148. These local polarizations in the ferroelectric layer 120 will determine the doping concentration in the vdW channel and the threshold voltage of the transistor. The transistor characteristics can be read out using the embedded gate 148.

Figure 2:
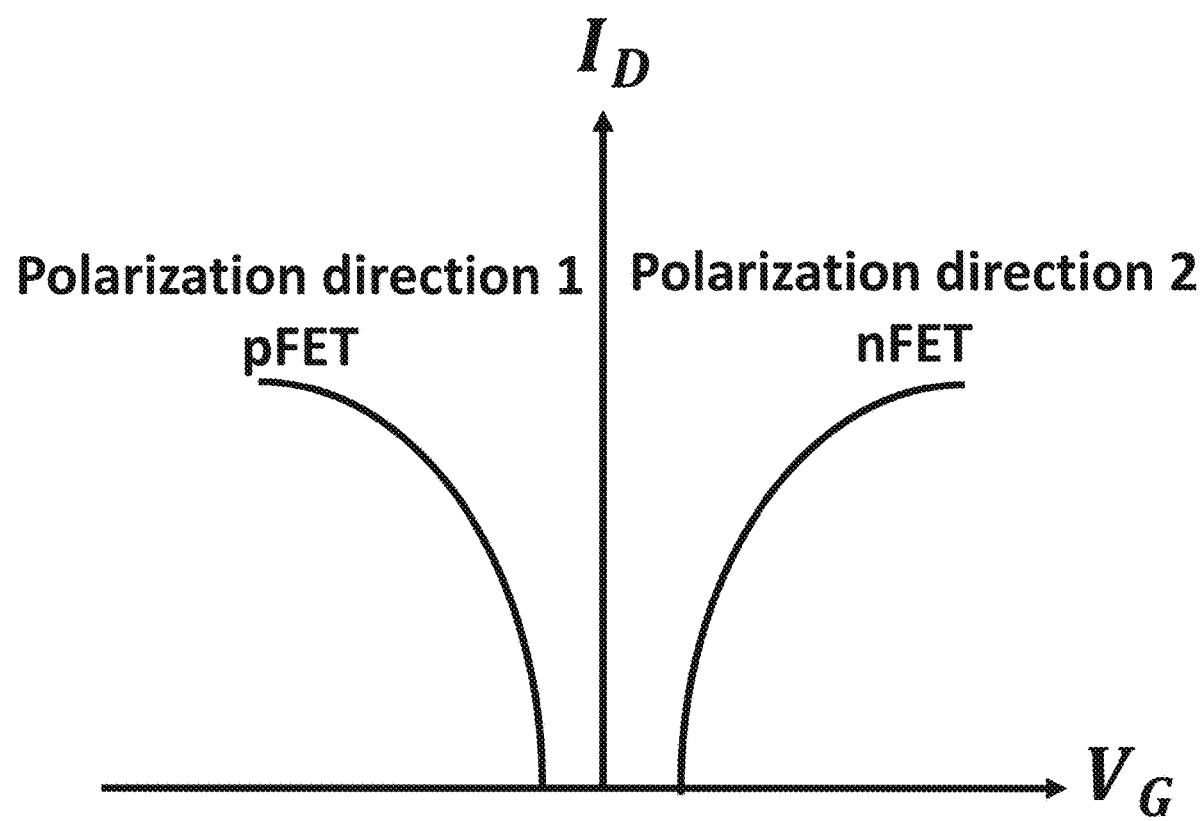
FIG. 2 illustrates the transfer characteristics of a transistor with switchable polarity and non-volatile configurations based on ferroelectric and van der Waal materials according to the invention, including the transistors of FIGS. 1A-1H.

FIG. 2 illustrates the transfer characteristics of a transistor with switchable polarity and non-volatile configurations based on ferroelectric and vdW materials according to the invention, including the transistors of FIGS. 1A-1H. The device shows pFET conduction behavior when the electric polarization of the ferroelectric polarity control layer is pointing to direction 1, while it shows nFET conduction behavior when the polarization is pointing to direction 2.

Figure 3A:
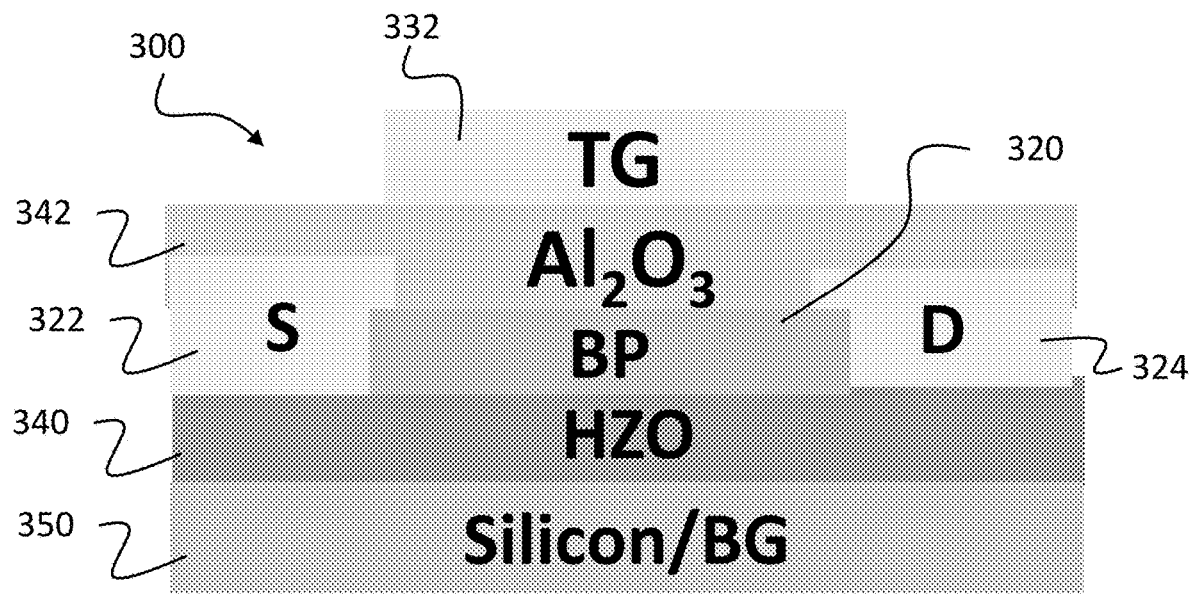
FIG. 3A shows an experimental transistor that was fabricated to demonstrate the operating principle of the polarity switchable logic devices.

Experiments were conducted to demonstrate the operating principles of the polarity switchable logic devices of the invention. As shown in FIG. 3A, a dual-gate field-effect transistor (FET) 300 with a black phosphorus (BP) vdW channel 320 was fabricated, with source 322 and drain 324 contracts, a top gate 332 and top gate dielectric 342. A 12 nm ALD hafnium zirconium oxide serves as bottom dielectric 340 formed on a Si substrate 350 while a 30 nm ALD $Al_2O_3$ serves as the top gate dielectric 342. The source/drain 322/324 electrodes and top gate electrode 332 were deposited with 15 nm Cr/Au. The thickness of black phosphorus flake used to form the vdW channel was ~20 nm. Here the silicon substrate serves as the back gate.

Figure 3B:
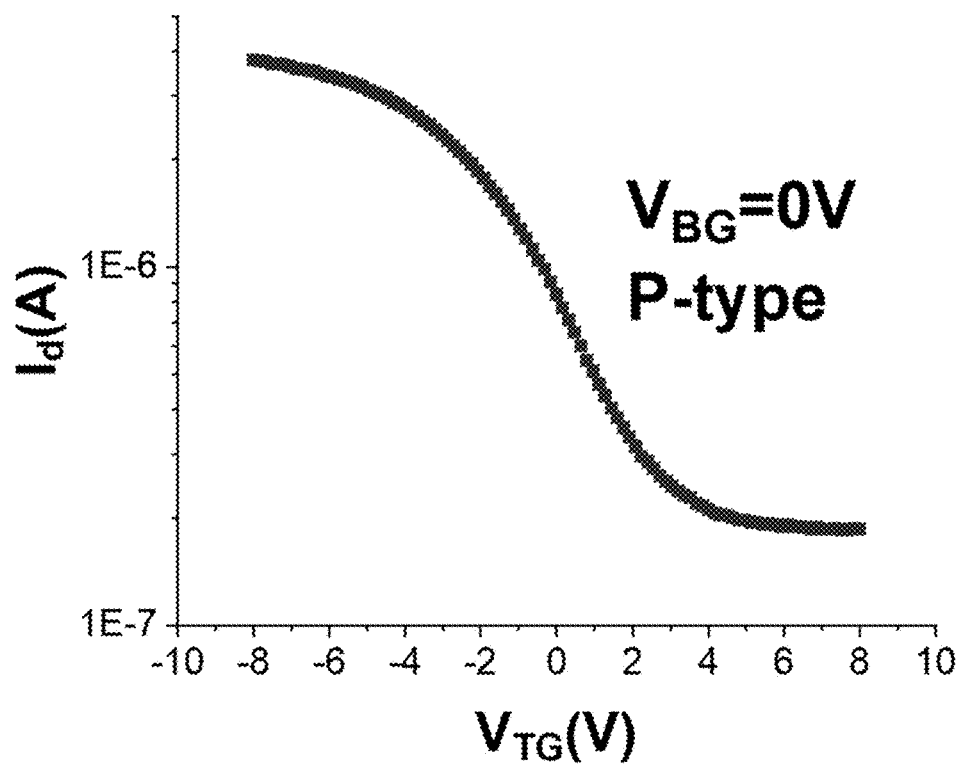
FIG. 3B-3D show the dynamic switching between electron and hole transport demonstrated experimentally with the FIG. 3A transistor.
Figure 3C:
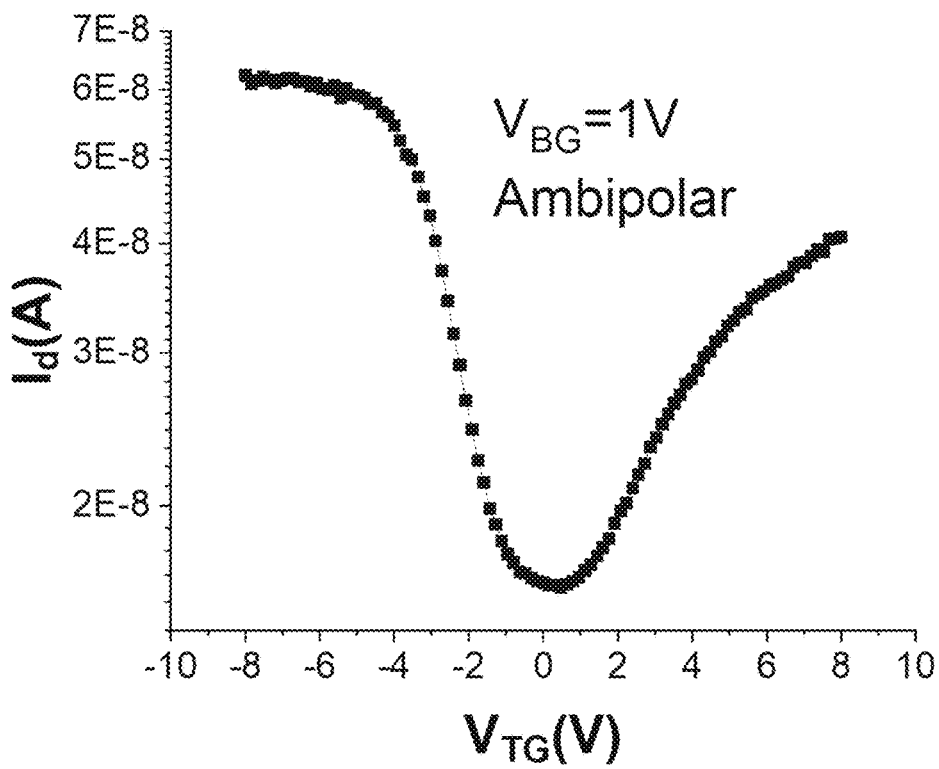
Figure 3D:
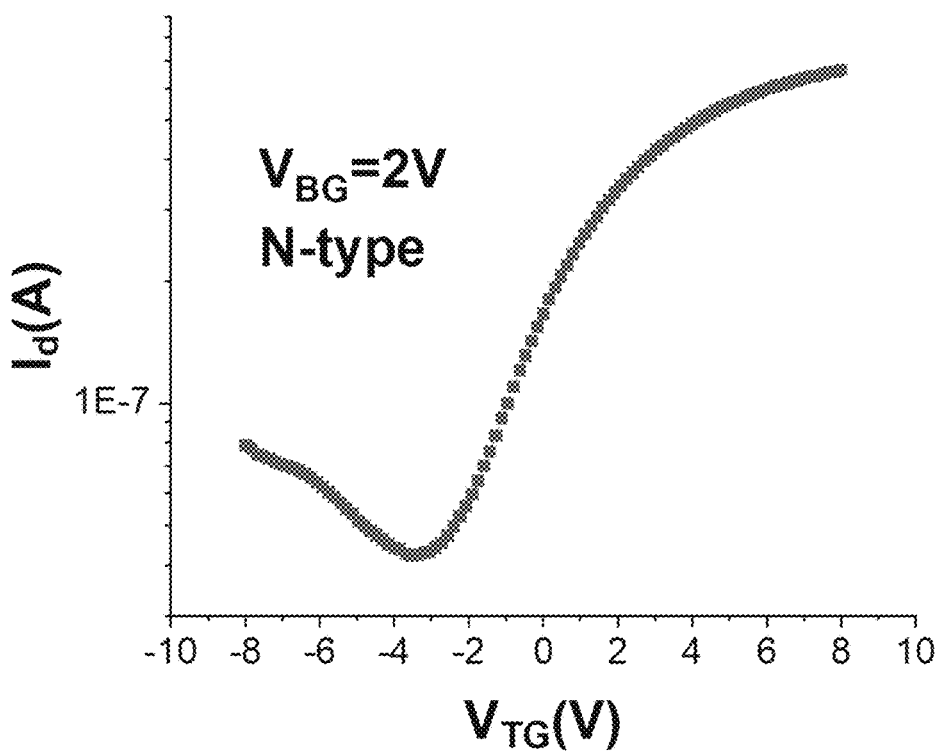

As seen in FIG. 3B, the transistor 300 shows dynamic switching between electron and hole transport. All three types of transport curves (p-type, ambipolar, and n-type) are observed with the back gate biased at 0 V, 1 V, 2V, respectively, as shown in FIG. 3B-3D. The low-voltage effective tuning of the carrier polarity in these devices is attributed to the small bandgap of BP ($E_g$~0.3 eV). This experiment indicates that the polarity of a transistor can be switched via electrostatic doping.

Figure 4A:
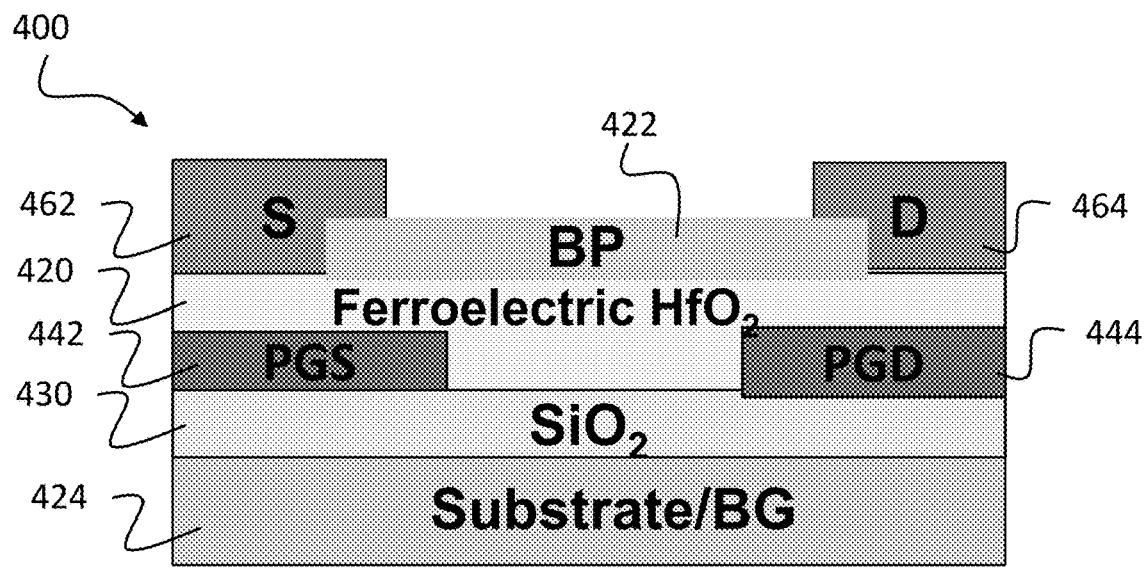
FIG. 4A is schematic cross-section of another experimental transistor that was fabricated to demonstrate the operating principle of the polarity switchable logic devices.
Figure 4B:
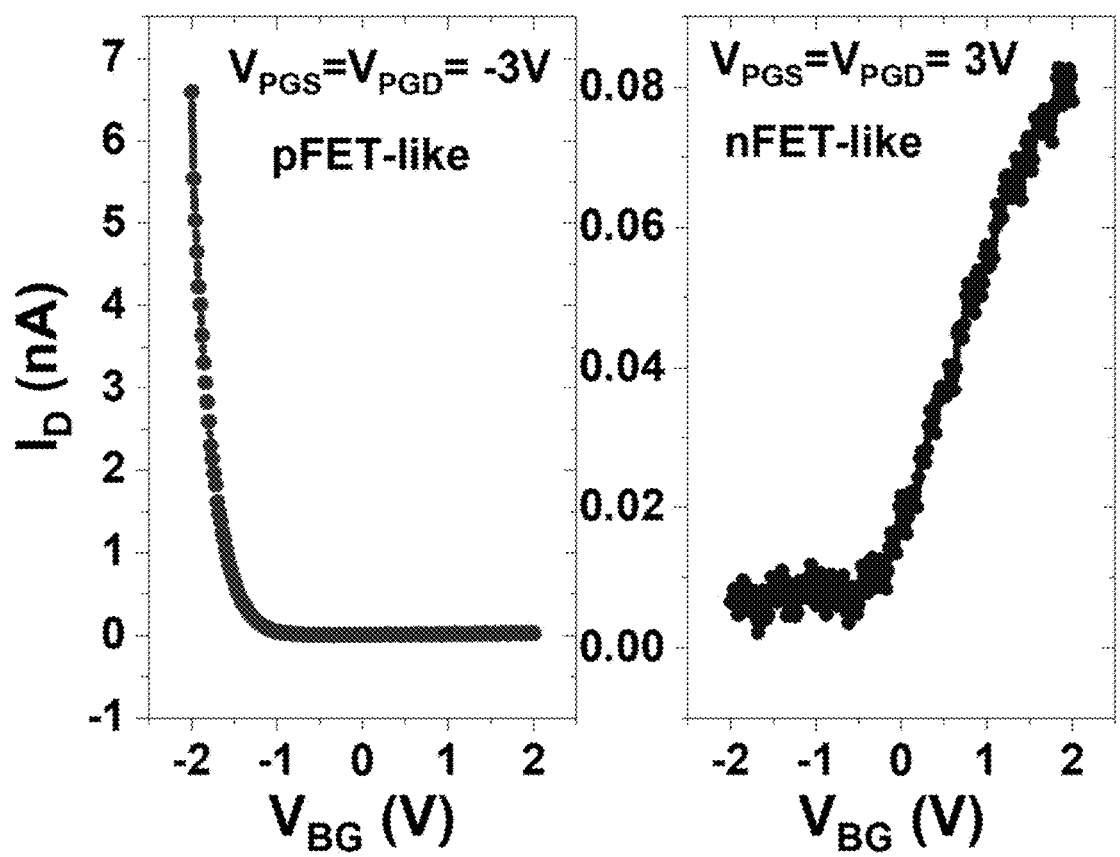
FIG. 4B illustrates the programmable pFET and nFET characteristics of the FIG. 4A experimental transistor.

FIG. 4A shows an additional experimental transistor 400 that is based upon the transistor 102 of FIG. 1A. The silicon substrate 424 serves as the back gate. Silicon oxide layer 430 is grown on the silicon substrate 424. The embedded program gates PGS 442 and PGD 444 are formed on the silicon oxide layer 430. A ferroelectric layer 420 consist of ferroelectric $HfO_2$ is formed on the program gates (PGS 442 and PGD 444) and $SiO_2$ layer 430. Black phosphorus layer 422 is transferred on the ferroelectric layer 420. The source and drain electrodes 462 and 464 are formed on the black phosphorus layer 422. The programmable pFET and nFET characteristics of the transistor 400 are shown in FIG. 4B. The polarity of the transistor 400 was switched from p-type to n-type when voltage applied on the embedded gates is changed from −3V to 3V. These results demonstrate that polarity of a black phosphorus transistor can be switched between pFET and nFET using the local program gates in the source/drain regions.

Figure 5A:
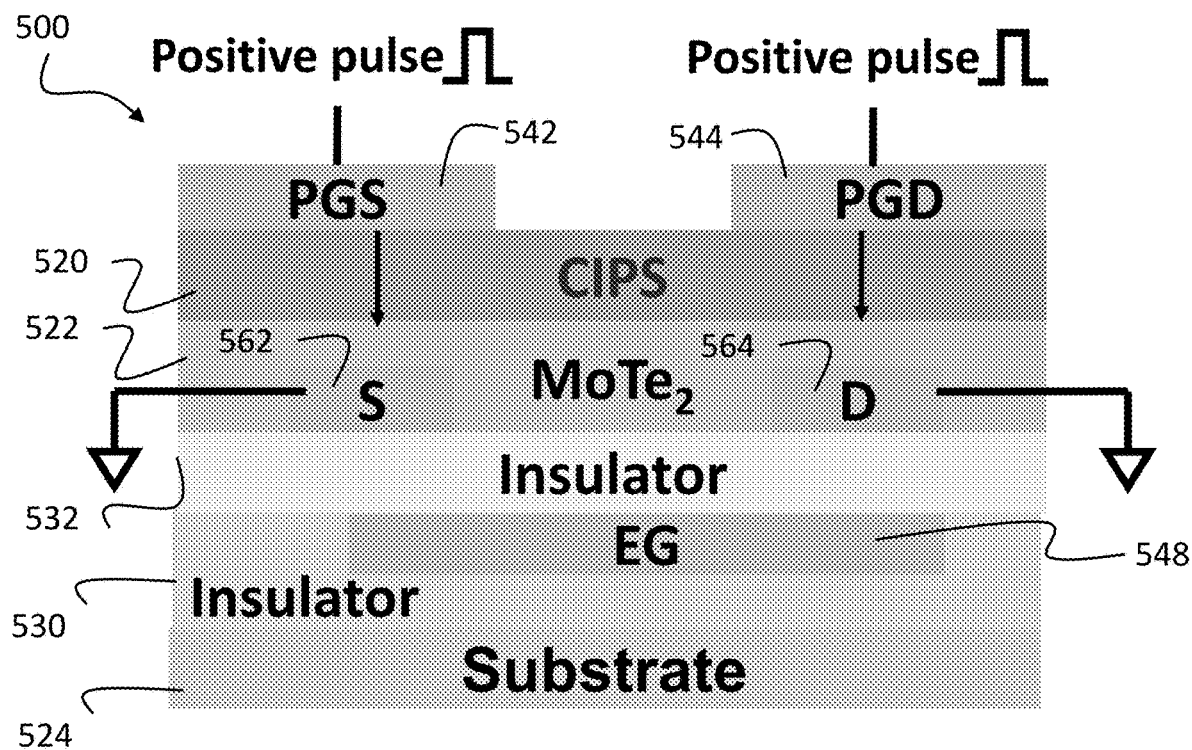
FIG. 5A is schematic cross-section of an experimental transistor that is based upon the transistor 116 of FIG. 1G.
Figure 5B:
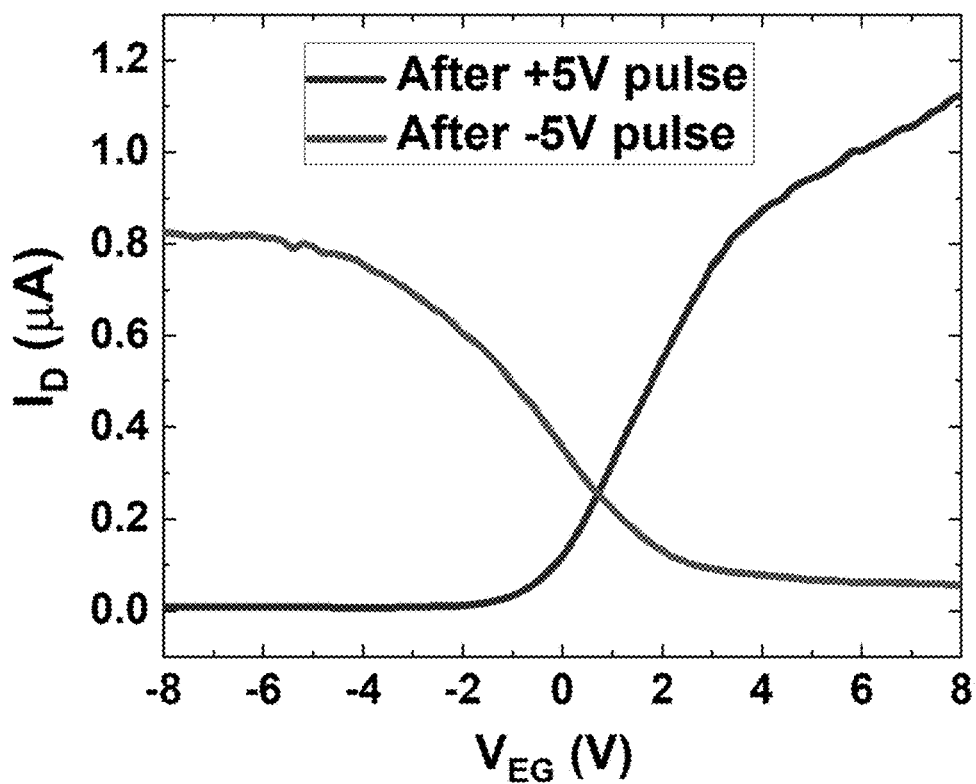
FIG. 5B illustrates the programmable and non-volatile pFET and nFET characteristics of the FIG. 5A experimental transistor.

FIG. 5A shows an additional experimental transistor 500 that is based upon the transistor 116 of FIG. 1G. $MoTe_2$ was used as the vdW semiconductor layer 522 and $CuInP_2S_6$ (CIPS) was used as the ferroelectric layer 520. The local program gates (PGS and PGD) 542 and 544 are used to program the polarization in the ferroelectric layer 520 of CIPS, which controls the polarity of the $MoTe_2$ transistor 500. Transistor operations are controlled through the source 562, the drain 564 and the embedded gate 548. After applying +5V (or −5V) pulse on the local program gates 542 and 544, the $MoTe_2$ transistor 500 was successfully reconfigured into nFET (or pFET). The non-volatile reprogrammable pFET and nFET characteristics are shown in FIG. 5B. Note that the transfer curves were measured after removing the program pulses, indicating that the polarity configuration is non-volatile in the transistor 500.

Figure 6:
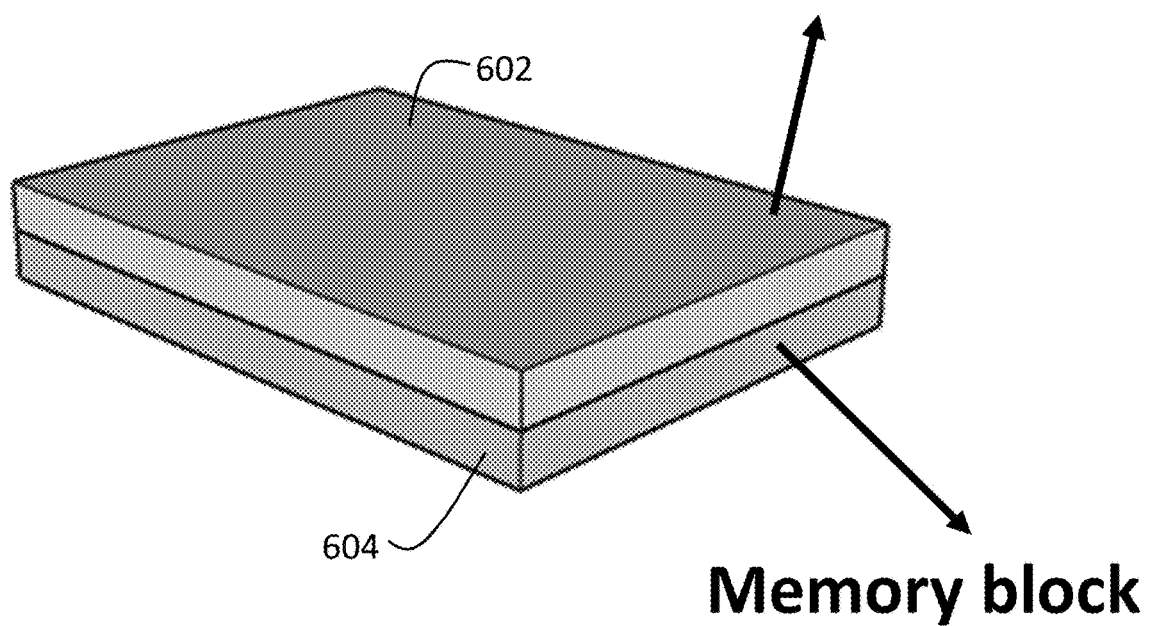
FIG. 6 is a schematic diagram of a preferred integration of reconfigurable logic circuits and memory circuits.

FIG. 6 shows the integration of a logic circuit 602 and a memory circuit 604. The logic circuit includes a plurality of logic units, each of which includes a plurality of the present transistors with switchable polarity and non-volatile configurations. The polarity of the transistor can be dynamically reconfigured into p-type or n-type. As a result, the logic circuit can change its function.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A transistor with switchable polarity and non-volatile configurations, comprising:
   a substrate;
   a first insulator layer on the substrate;
   an embedded gate on the first insulator layer;
   a second insulator layer around and on the embedded gate;
   local program gates separated from each other on the second insulator layer;
   a ferroelectric material layer around and on the local program gates;
   a van der Waals (vdW) semiconductor layer on the ferroelectric material layer; and
   source and drain contacts separated from each on the ferroelectric material layer and the van der Waals (vdW) semiconductor layer.

2. The transistor of claim 1, comprising:
   a third insulator layer on the van der Waals (vdW) semiconductor layer and the source and drain contacts; and
   a top gate on the third insulator layer isolated from the source and drain contacts by the third insulator layer.

3. The transistor of claim 1, wherein the ferroelectric material layer is selected from the group consisting of ferroelectric hafnium or zirconium oxide, a perovskite including but not limited to lead zirconate titanate (PZT), Barium titanate (BTO), and lead magnesium niobate-lead titanate (PMN-PT), aurivillius compounds including but not limited to strontium bismuth tantalate (SBT), polymeric ferroelectric including but not limited to polyvinylidene fluoride (PVDF), and vdW ferroelectrics including but not limited to $CuInP_2S_6$ (CIPS).

4. The transistor of claim 3, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

5. The device of claim 1, wherein the van der Waals (vdW) semiconductor layer is selected from the group consisting of black phosphorous, $MoTe_2$, $WSe_2$, $HfS_2$, $ZrS_2$, $TiS_2$, $Mo_{1-x}W_xTe_2$, $MoS_{2-2x}Te_{2x}$, $MoSe_{2-2x}Te_{2x}$, $WS_{2-2x}Te_{2x}$, $WSe_{2-2x}Te_{2x}$, $Hf_2CO_2$, $Sc_2CF_2$, $Ti_2CO_2$, $Zr_2CO_2$, germanane, and heterostructures based on these materials.

6. A transistor with switchable polarity and non-volatile configurations, comprising:
   a substrate;
   a first insulator layer on the substrate;
   a van der Waals (vdW) semiconductor layer on the first insulator layer;
   source and drain contacts separated from each on the first insulator layer and under a portion of the van der Waals (vdW) semiconductor layer;
   a ferroelectric material layer on the van der Waals (vdW) semiconductor layer;
   local program gates separated from each other on the ferroelectric material layer.

7. The transistor of claim 6, comprising:
   a second insulator layer on the ferroelectric material layer; and
   a top gate on the second insulator layer isolated from the local program gates by the second insulator layer.

8. The transistor of claim 6, wherein the ferroelectric material layer is selected from the group consisting of ferroelectric hafnium or zirconium oxide, a perovskite including but not limited to lead zirconate titanate (PZT), Barium titanate (BTO), and lead magnesium niobate-lead titanate (PMN-PT), aurivillius compounds including but not limited to strontium bismuth tantalate (SBT), polymeric ferroelectric including but not limited to polyvinylidene fluoride (PVDF), and vdW ferroelectrics including but not limited to $CuInP_2S_6$ (CIPS).

9. The transistor of claim 8, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

10. The device of claim 6, wherein the van der Waals (vdW) semiconductor layer is selected from the group consisting of black phosphorous, $MoTe_2$, $WSe_2$, $HfS_2$, $ZrS_2$, $TiS_2$, $Mo_{1-x}W_xTe_2$, $MoS_{2-2x}Te_{2x}$, $MoSe_{2-2x}Te_{2x}$, $WS_{2-2x}Te_{2x}$, $WSe_{2-2x}Te_{2x}$, $Hf_2CO_2$, $Sc_2CF_2$, $Ti_2CO_2$, $Zr_2CO_2$, germanane, and heterostructures based on these materials.

11. A transistor with switchable polarity and non-volatile configurations, comprising:
   a substrate;
   a first insulator layer on the substrate;
   an embedded gate on the first insulator layer;
   a second insulator layer around and on the embedded gate;
   a van der Waals (vdW) semiconductor layer on the second insulator layer;
   source and drain contacts separated from each other on the second insulator layer and under a portion of the van der Waals (vdW) semiconductor layer;
   a ferroelectric material layer on the van der Waals (vdW) semiconductor layer;

local program gates separated from each other on the ferroelectric material layer.

12. The transistor of claim 11, comprising:
a third insulator layer on the ferroelectric material layer; and
a top gate on the third insulator layer isolated from the local program gates by the third insulator layer.

13. The transistor of claim 11, wherein the ferroelectric material layer is selected from the group consisting of ferroelectric hafnium or zirconium oxide, a perovskite including but not limited to lead zirconate titanate (PZT), Barium titanate (BTO), and lead magnesium niobate-lead titanate (PMN-PT), aurivillius compounds including but not limited to strontium bismuth tantalate (SBT), polymeric ferroelectric including but not limited to polyvinylidene fluoride (PVDF), and vdW ferroelectrics including but not limited to $CuInP_2S_6$ (CIPS).

14. The transistor of claim 13, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

15. The device of claim 11, wherein the van der Waals (vdW) semiconductor layer is selected from the group consisting of black phosphorous, $MoTe_2$, $WSe_2$, $HfS_2$, $ZrS_2$, $TiS_2$, $Mo_{1-x}W_xTe_2$, $MoS_{2-2x}Te_{2x}$, $MoSe_{2-2x}Te_{2x}$, $WS_{2-2x}Te_{2x}$, $WSe_{2-2x}Te_{2x}$, $Hf_2CO_2$, $Sc_2CF_2$, $Ti_2CO_2$, $Zr_2CO_2$, germanane, and heterostructures based on these materials.

* * * * *